(12) United States Patent
Hojo et al.

(10) Patent No.: US 7,524,604 B2
(45) Date of Patent: Apr. 28, 2009

(54) POSITIVE RESIST COMPOSITION AND METHOD OF FORMATION OF RESIST PATTERNS

(75) Inventors: Takuma Hojo, Kawasaki (JP); Kiyoshi Ishikawa, Kawasaki (JP)

(73) Assignee: Tokyo Ohka Kogyo Co., Ltd, Kawasaki-shi (JP)

( * ) Notice: Subject to any disclaimer, the term of this patent is extended or adjusted under 35 U.S.C. 154(b) by 0 days.

(21) Appl. No.: 10/553,083

(22) PCT Filed: Apr. 15, 2004

(86) PCT No.: PCT/JP2004/005402

§ 371 (c)(1),
(2), (4) Date: Oct. 11, 2005

(87) PCT Pub. No.: WO2004/097524

PCT Pub. Date: Nov. 11, 2004

(65) Prior Publication Data

US 2006/0247346 A1 Nov. 2, 2006

(30) Foreign Application Priority Data

Apr. 30, 2003 (JP) .............................. 2003-125242

(51) Int. Cl.
*G03F 7/039* (2006.01)
*G03F 7/38* (2006.01)

(52) U.S. Cl. ..................... 430/270.1; 430/326; 430/330

(58) Field of Classification Search ................ 430/272.1
See application file for complete search history.

(56) References Cited

U.S. PATENT DOCUMENTS

| 5,558,971 | A | | 9/1996 | Urano et al. |
| 6,133,412 | A | * | 10/2000 | Malik et al. .................. 528/425 |
| 6,835,804 | B2 | | 12/2004 | Takeda et al. |
| 2002/0111459 | A1 | | 8/2002 | Takeda et al. |
| 2003/0232273 | A1 | | 12/2003 | Adams et al. |
| 2006/0247346 | A1 | * | 11/2006 | Hojo et al. .................. 524/155 |
| 2007/0160927 | A1 | * | 7/2007 | Murakami et al. ....... 430/270.1 |

FOREIGN PATENT DOCUMENTS

| EP | 0932082 A2 * | 7/1999 |
| JP | 11-002902 | 1/1999 |
| JP | 11-030865 | 2/1999 |
| JP | 2001-316418 | 11/2001 |
| JP | 2002-139838 | 5/2002 |
| JP | 2002-323768 | 11/2002 |
| JP | 2002-333713 | 11/2002 |
| JP | 2002-333713 A * | 11/2002 |
| JP | 2002-341538 | 11/2002 |
| JP | 2002-341538 A * | 11/2002 |
| JP | 2003-307840 | 10/2003 |

| WO | WO 2004070473 A1 * | 8/2004 |

OTHER PUBLICATIONS

Malik et al, "Lithographic properties of novel acetal-derivatized hydroxy styrene polymers", Proceedings of SPIE—vol. 3678 Advances in Resist Technology and Processing XVI, Will Conley, Editor, Jun. 1999, pp. 388-400.*
Iwanaga Shinichiro et al (JP 11-002902) Machine English translation from www19.ipdl.ncipi.go.jp website.*
Derwent-Acc-No. 1999-126674 abstract of JP 11002902 A, Derwent Information LTD, 2 pages.*
AN 1999:23513 from CAPLUS, ACS on STN, enterd STN Jan. 12, 1999, English Abstract of JP 11002902.*
Tanabe Takyoshi et al (JP 11-030865) Machine English translation from www19.ipdl.ncipi.go.jp website.*
Momoto Atsushi et al (JP 2003-307840) Machine English translation from www19.ipdl.ncipi.go.jp website.*
Pasini et al , SPIE Conference on Advances in Resist TEchnology and processing XVI, Santa Clara, CA, Mar. 1999, SPIE Vo. 3676 pp. 94-101.*

(Continued)

*Primary Examiner*—Cynthia Hamilton
(74) *Attorney, Agent, or Firm*—Knobbe, Martens, Olson & Bear, LLP

(57) ABSTRACT

The invention provides a positive resist composition which has high etching resistance and attains high resolution, and a method of forming patterns by using the positive resist composition. The positive resist composition contains a resin component (A), which has acid dissociable, dissolution inhibiting groups, and exhibits increased alkali solubility under the action of acid, and an acid generator component (B) which generates acid on exposure, wherein the resin component (A) is a polymer comprising structural units (a1) represented by the general formula (I) shown below, and a portion of the hydroxyl groups of the units (a1) are protected by replacing the hydrogen atoms of the hydroxyl groups with acid dissociable, dissolution inhibiting groups represented by the general formula (II) shown below:

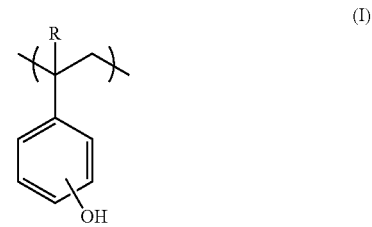

(wherein, R is a hydrogen atom or methyl group, $R^1$ is an alkyl group having 1 to 5 carbon atoms, $R^2$ is an alkyl group having 1 to 5 carbon atoms or a hydrogen atom, and X is an aliphatic polycyclic group having 10 to 16 carbon atoms or an aromatic polycyclic hydrocarbon group having 10 to 16 carbon atoms.)

9 Claims, No Drawings

OTHER PUBLICATIONS

Hein et al, Advances in Rist TEchnology and Processing XVIII, Houlihan, ed, Proceedings of SPIE vol. 4345 (2001 no month) pp. 439-447.*

Tomoya et al, English abstract of JP2002341538, publication date Nov. 27, 2002, data supplied by esp@cenet database from applicant, one page dated Oct. 2, 2007.*

Tomoya et al, English abstract and machine translation of JP 2002-333713, date of publication Nov. 22, 2002 (obtained from applicant) 59 pages from Abstracts of Japan and JPO and INPIT.*

Written Opinion from Singapore application No. SG 200506403-5 dated Feb. 9, 2007.

* cited by examiner

POSITIVE RESIST COMPOSITION AND METHOD OF FORMATION OF RESIST PATTERNS

This application is the U.S. National Phase under 35 U.S.C. §371 of International Application PCT/JP2004/005402, filed Apr. 15, 2004, which claims priority to Japanese Patent Application No. P2003-125242, filed Apr. 30, 2003. The International Application was published under PCT Article 21(2) in a language other than English.

TECHNICAL FIELD

The present invention relates to a positive resist composition and a method of formation of resist patterns.

BACKGROUND ART

In recent years, advances in lithography techniques have lead to ongoing, rapid miniaturization of resist patterns. Recently, levels of resolution capable of forming line and space patterns of no more than 100 nm, and isolated patterns of no more than 70 nm, are being demanded.

In the microprocessing technology used for realizing these high resolution levels, positive resist compositions that have been proposed as ideal resist materials, particularly for use in methods using electron beam exposure, typically employ a polyhydroxystyrene-based resin, in which a portion of the hydroxyl groups have been protected with acid dissociable, dissolution inhibiting groups, as the base resin.

Examples of the most commonly used acid dissociable, dissolution inhibiting groups include so-called acetal groups, including chain-like ether groups typified by 1-ethoxyethyl groups, and cyclic ether groups typified by tetrahydropyranyl groups, as well as tertiary alkyl groups typified by tert-butyl groups, and tertiary alkoxycarbonyl groups typified by tert-butoxycarbonyl groups.

(Patent Reference 1)
Japanese Unexamined Patent Application, First Publication No. 2002-341538

However, in microprocessing technology, the formation of high aspect ratio, fine patterns, and particularly line and space patterns of no more than 100 nm, has proven very difficult due to pattern collapse caused by the surface tension of the developing solution. One possible countermeasure involves reducing the thickness of the resist film, but if the film thickness is reduced using conventional resist compositions, then the etching resistance tends to be inadequate.

DISCLOSURE OF INVENTION

The present invention takes the above problems associated with the conventional technology into consideration, with an object of providing a positive resist composition which exhibits a high level of etching resistance and enables high resolution to be attained, as well as a method of forming patterns that uses the positive resist composition.

As a result of intensive investigations aimed at achieving the above object, the inventors of the present invention discovered that by using a resin with bulky protective groups as the resin component used within the positive resist composition, the etching resistance could be improved, enabling the thickness of the resist film to be reduced, and they were hence able to achieve the above object and complete the present invention.

In other words, the present invention provides a positive resist composition that includes a resin component (A), which contains acid dissociable, dissolution inhibiting groups, and exhibits increased alkali solubility under the action of acid, and an acid generator component (B) that generates acid on exposure, wherein the resin component (A) is a polymer containing structural units (a1) represented by a general formula (I) shown below, and a portion of the hydroxyl groups of the structural units (a1) are protected by substituting the hydrogen atoms of the hydroxyl groups with acid dissociable, dissolution inhibiting groups represented by a general formula (II) shown below.

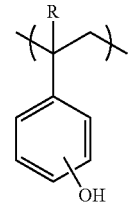

(I)

(wherein, R represents a hydrogen atom or a methyl group)

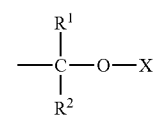

(II)

(wherein, $R^1$ represents an alkyl group of 1 to 5 carbon atoms, $R^2$ represents an alkyl group of 1 to 5 carbon atoms or a hydrogen atom, and X represents an aliphatic polycyclic group or an aromatic polycyclic hydrocarbon group)

Furthermore, the present invention also provides a method of forming resist patterns that includes the steps of applying the above positive resist composition to a substrate, conducting a prebake, performing selective exposure, and then conducting post exposure baking (PEB), and performing alkali developing to form the resist pattern.

In this description, the term "structural unit" refers to a monomer unit that contributes to the formation of a polymer.

Furthermore, the term "exposure" also includes irradiation with an electron beam.

BEST MODE FOR CARRYING OUT THE INVENTION

As follows is a more detailed description of the present invention.

[Positive Photoresist Composition]

A positive resist composition of the present invention includes a resin component (A) (in this description also referred to as the "component (A)"), which contains acid dissociable, dissolution inhibiting groups, and exhibits increased alkali solubility under the action of acid, and an acid generator component (B) (in this description also referred to as the "component (B)") that generates acid on exposure.

Regarding the component (A), the action of acid generated from the aforementioned component (B) by exposure causes the acid dissociable, dissolution inhibiting groups to dissociate, causing the entire component (A) to change from an alkali insoluble state to an alkali soluble state.

As a result, when a resist is exposed through a mask pattern during the formation of a resist pattern, or alternatively, is exposed and then subjected to post exposure baking, the exposed portions of the resist shift to an alkali soluble state, whereas the unexposed portions remain insoluble in alkali, meaning that alkali developing can then be used to form a positive resist pattern.

[Resin Component (A)]

The resin component (A) of a positive resist composition according to the present invention contains the aforementioned structural units (a1) (in this description also referred to as "(a1) units") as essential structural units, and a portion of the hydroxyl groups of these (a1) units are protected by substituting the hydrogen atoms of the hydroxyl groups with acid dissociable, dissolution inhibiting groups.

[(a1) Units]

The (a1) units are structural units represented by a general formula (I) shown below, and a portion of the hydroxyl groups of these (a1) units are protected by acid dissociable, dissolution inhibiting groups represented by a general formula (II) shown below.

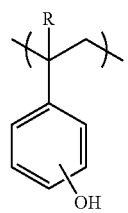

(I)

(wherein, R represents a hydrogen atom or a methyl group)

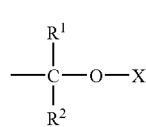

(II)

(wherein, $R^1$ represents an alkyl group of 1 to 5 carbon atoms, $R^2$ represents an alkyl group of 1 to 5 carbon atoms or a hydrogen atom, and X represents an aliphatic polycyclic group or an aromatic polycyclic hydrocarbon group)

In the (a1) unit, R represents a hydrogen atom or a methyl group, although a hydrogen atom is preferred. If R is a hydrogen atom, then the protection ratio for the hydroxyl groups can be improved, enabling the contrast to be improved. Furthermore, the rate of dissolution following developing can also be improved. The bonding position of the hydroxyl group may be the o-position, the m-position, or the p-position, although from the viewpoints of availability and cost, the p-position is preferred.

A portion of the hydroxyl groups of the (a1) units must be protected by acid dissociable, dissolution inhibiting groups represented by the above general formula (II).

$R^1$ is a straight chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group, or neopentyl group. From an industrial viewpoint, a methyl group or ethyl group is preferred.

$R^2$ is an alkyl group of 1 to 5 carbon atoms or a hydrogen atom. Examples of suitable alkyl groups of 1 to 5 carbon atoms include the same substituent groups described above for $R^1$. Of these, from an industrial viewpoint, $R^2$ is preferably a hydrogen atom.

X is an aliphatic polycyclic group or an aromatic polycyclic hydrocarbon group, and is preferably an aliphatic polycyclic group of 10 to 16 carbon atoms, or an aromatic polycyclic hydrocarbon group of 10 to 16 carbon atoms. Of these groups, aliphatic polycyclic groups are preferred, as they produce superior levels of line edge roughness, and rectangularity of the cross-sectional shape for the resulting resist pattern.

Examples of aliphatic polycyclic groups of 10 to 16 carbon atoms include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. These types of polycyclic groups can be appropriately selected from the multitude of groups proposed for use with conventional ArF resists. Of these groups, adamantyl groups, norbornyl groups, and tetracyclododecanyl groups are preferred industrially, and adamantyl groups are particularly desirable.

If X is an aliphatic polycyclic group, then a high level of resolution can be achieved, and the cross-sectional shape of the resist pattern is a favorable rectangular shape.

Examples of aromatic polycyclic hydrocarbon group of 10 to 16 carbon atoms include groups in which one hydrogen atom has been removed from naphthalene, anthracene, phenanthrene or pyrene. Specific examples include a 1-naphthyl group, 2-naphthyl group, 1-anthracenyl group, 2-anthracenyl group, 1-phenanthryl group, 2-phenanthryl group, 3-phenanthryl group or 1-pyrenyl group, and of these, a 2-naphthyl group is preferred industrially.

If X is an aromatic polycyclic hydrocarbon group, then the sensitivity is favorable, and the throughput is high, meaning the productivity can be improved.

Specific examples of preferred forms of the acid dissociable, dissolution inhibiting group in an (a1) unit are shown below.

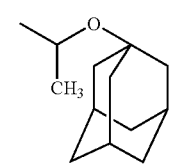

(II-a)

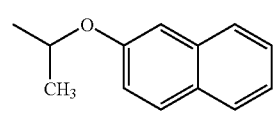

(II-b)

resist composition of the present invention, the polymer of the component (A) may also be a copolymer that contains, in addition to the aforementioned (a1) units, the structural units (a2) (in this description also referred to as "(a2) units").

[(a2) Units]

An (a2) unit is a structural unit represented by a general formula (III) shown below.

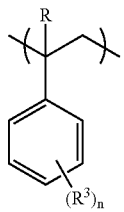

(III)

(wherein, R represents a hydrogen atom or a methyl group, $R^3$ represents an alkyl group of 1 to 5 carbon atoms, and n represents either 0, or an integer from 1 to 3)

$R^3$ is a straight chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group, or neopentyl group. From an industrial viewpoint, a methyl group or ethyl group is preferred.

The aforementioned n is either 0, or an integer from 1 to 3. Of these possibilities, n is preferably either 0 or 1, and from an industrial viewpoint, is most preferably 0.

In those cases where n is from 1 to 3, the bonding position of the substituent group $R^3$ may be the o-position, the m-position, or the p-position, and if n is 2 or 3, then any combination of substituent positions is suitable.

In the present invention, the inclusion of (a2) units is not essential, but including them enables the alkali solubility to be controlled in accordance with the (a2) unit content, and other benefits are also obtained, including a reduction in line edge roughness, and an ability to produce favorable isolated line patterns. If (a2) units are used, then the quantity of such units is preferably within a range from 0.5 to 25 mol %, and even more preferably from 3 to 20 mol %, relative to the combined total of all the structural units that constitute the component (A). If the (a2) unit content is greater than this range, then line edge roughness tends to increase, and favorable isolated lines become more difficult to achieve.

In a positive resist composition of the present invention, as the component (A), either a single polymer described above, or a mixture of two or more such polymers, may be used.

In those cases where a mixture of two or more polymers is used, any two or more polymers selected from a group consisting of polymers containing the aforementioned (a1) units, wherein a portion of the hydroxyl groups of these (a1) units are protected by acid dissociable, dissolution inhibiting groups, and copolymers containing the (a1) units and the aforementioned (a2) units, wherein a portion of the hydroxyl groups of the (a1) units are protected by acid dissociable, dissolution inhibiting groups, can be used. In a preferred configuration, a mixture of a polymer containing the (a1) units, wherein a portion of the hydroxyl groups of these (a1) units are protected by acid dissociable, dissolution inhibiting groups, and a copolymer containing the (a1) units and the (a2) units, wherein a portion of the hydroxyl groups of the (a1) units are protected by acid dissociable, dissolution inhibiting groups, is used. By using this type of mixture as the component (A), the shape of the formed resist pattern exhibits favorable rectangularity, and a superior isolated line pattern can be obtained.

The weight average molecular weight (the polystyrene equivalent value, this also applies to all subsequent molecular weight values) of the polymer of the component (A), prior to protection with the acid dissociable, dissolution inhibiting groups, is preferably within a range from 2,000 to 30,000, and even more preferably from 5,000 to 20,000. By ensuring that the weight average molecular weight is no more than 30,000, the solubility in the resist solvent can be improved, whereas ensuring that the value is at least 2,000 enables a favorable resist pattern shape to be obtained.

Furthermore, in terms of the polydispersity (the weight average molecular weight divided by the number average molecular weight, this also applies below) of the polymer of the component (A), prior to protection with the acid dissociable, dissolution inhibiting groups, a monodisperse component with a small polydispersity yields superior resolution and is consequently preferred. Specifically, the polydispersity is preferably no more than 2.0, and even more preferably 1.5 or less.

In the present invention, the proportion of (a1) units that have been protected with acid dissociable, dissolution inhibiting groups, relative to the combined total of all the structural units that constitute the polymer of component (A), is preferably within a range from 5 to 35 mol %.

If the polymer contains no (a2) units, then the proportion of structural units that have been protected with acid dissociable, dissolution inhibiting groups, relative to the combined total of all the structural units, is preferably within a range from 5 to 35 mol %, and even more preferably from 20 to 30 mol %.

If the polymer contains (a2) units, then the proportion of structural units that have been protected with acid dissociable, dissolution inhibiting groups, relative to the combined total of all the structural units, is preferably within a range from 5 to 35 mol %, and even more preferably from 10 to 20 mol %.

By ensuring that the proportion is at least as large as the lower limit of the above range, favorable contrast can be achieved, whereas ensuring that the proportion is no greater than the upper limit of the above range enables a developing defect suppression effect to be achieved.

The component (A) can be produced, for example, by polymerizing a monomer corresponding with (a1) in which the hydroxyl group is not protected, and then using a known method to protect a portion of the hydroxyl groups of the (a1) units with acid dissociable, dissolution inhibiting groups.

Furthermore, the component (A) can also be produced by preparing a monomer corresponding with (a1), in which the hydroxyl group has been protected with an acid dissociable, dissolution inhibiting group, subsequently polymerizing this monomer using normal methods, and then using hydrolysis to change a portion of the hydroxyl groups that have been protected with acid dissociable, dissolution inhibiting groups back to hydroxyl groups.

The quantity of the component (A) within a positive resist composition of the present invention can be adjusted in accordance with the resist film thickness that is to be formed. Reported as a solid fraction concentration, the quantity is typically within a range from 5 to 25% by weight, and even more preferably from 7 to 20% by weight.

[Acid Generator Component (B)]

In the present invention, as the acid generator component (B), a compound appropriately selected from known materials used as acid generators in conventional chemically amplified resists can be used.

Specific examples of suitable diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these, onium salts containing a fluorinated alkylsulfonate ion as an anion are preferred.

Specific examples of suitable oxime sulfonate-based compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

As the component (B), either a single acid generator or a combination of two or more different acid generators may be used.

The quantity used of the component (B) is typically within a range from 1 to 20 parts by weight, and preferably from 2 to 10 parts by weight, per 100 parts by weight of the component (A). If the quantity is lower than the above range, then there is a danger that pattern formation may not progress satisfactorily, whereas if the quantity exceeds the above range it becomes difficult to achieve a uniform solution, and there is also a danger of a deterioration in the storage stability of the composition.

[Organic Solvent (C)]

A positive resist composition according to the present invention can be produced by dissolving the materials in an organic solvent (C).

The organic solvent (C) may be any solvent capable of dissolving each of the components used to generate a uniform solution, and one or more solvents selected from known materials used as the solvents for conventional chemically amplified resists can be used.

Specific examples of the organic solvent (C) include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent of two or more different solvents.

There are no particular restrictions on the quantity used of the organic solvent (C), which is selected to yield a concentration that is able to be applied to a substrate or the like. The quantity of the organic solvent (C) is selected so that the solid fraction concentration (the combined total of the component (A), the component (B), the optional components (D) and (E) described below, and any other optional components) for the positive resist composition is within a range from 3 to 30% by weight, and the actual quantity is set in accordance with the film thickness of the resist.

[Nitrogen-Containing Organic Compound (D)]

In a positive resist composition of the present invention, in order to improve the resist pattern shape and the post exposure stability of the latent image formed by the pattern-wise exposure of the resist layer, a nitrogen-containing organic compound can also be added as a separate, optional component (D).

A multitude of these nitrogen-containing organic compounds have already been proposed, and any of these known compounds can be used, although a secondary aliphatic amine or tertiary aliphatic amine is preferred. Here, an aliphatic amine refers to an alkyl or alkylalcohol amine.

Specific examples of the component (D) include alkyl amines such as trimethylamine, diethylamine, triethylamine, di-n-propylamine, tri-n-propylamine, tripentylamine, tri-n-heptylamine, tri-n-octylamine, di-n-heptylamine, di-n-octylamine, and tri-n-dodecylamine; and alkylalcohol amines such as diethanolamine, triethanolamine, diisopropanolamine, triisopropanolamine, di-n-octanolamine, and tri-n-octanolamine. Of these, secondary or tertiary aliphatic amines containing an alkyl group of 7 to 15 carbon atoms are preferred. By ensuring that the component contains an alkyl group of 7 to 15 carbon atoms, the dispersion of the aliphatic amine through the resist pattern is suppressed, enabling a more uniform distribution. In the present invention, alkyl amines such as tri-n-octylamine are particularly preferred.

These compounds may be used alone, or in combinations of two or more different compounds.

This component (D) is typically added in a quantity within a range from 0.01 to 5.0 parts by weight per 100 parts by weight of the component (A).

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof can also be added as another optional component (E). The component (D) and the component (E) can be used in combination, or either one can also be used alone.

Examples of suitable organic caroxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

[Other Optional Components]

Other miscible additives can also be added to a positive resist composition of the present invention according to need, and examples include additive resins for improving the properties of the resist film, surfactants for improving the ease of application, dissolution inhibitors, plasticizers, stabilizers, colorants, and halation prevention agents.

The acid dissociable, dissolution inhibiting groups of the structural units (a1) introduced into the resin component (A) represent an important characteristic of a positive resist composition of the present invention. Namely, by using the type of bulky acid dissociable, dissolution inhibiting groups described above, the etching resistance can be improved, the thickness of the resist film can be reduced, and pattern collapse of the resist pattern can be prevented.

[Method of Forming Resist Patterns]

A method of forming a resist pattern according to the present invention can be conducted, for example, in the manner described below.

Namely, a positive resist composition described above is first applied to the surface of a substrate such as a silicon wafer using a spinner or the like, a prebake is conducted under temperature conditions of 80 to 150° C. for 40 to 120 seconds, and preferably for 60 to 90 seconds, and the resulting film is then subjected to selective exposure through a desired mask pattern with either an electron beam, or some other form of radiation such as far ultraviolet radiation, using an electron beam exposure apparatus or the like. In other words, following exposure through a mask pattern, or direct patterning of the resist film with an electron beam without using a mask pattern, PEB (post exposure baking) is conducted under temperature conditions of 80 to 150° C. for 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength of the electron beam or far ultraviolet radiation used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used.

A photoresist composition according to the present invention exhibits superior etching resistance to conventional compositions, enables reductions in the thickness of the resist film, and prevents pattern collapse. Accordingly, because the composition is ideally suited for microprocessing applications, it is particularly effective for use with an EB (electron beam).

Subsequently, the resist pattern obtained in the manner described above is typically used as a mask for conducting etching, thereby selectively removing those portions of the substrate or the like not covered by the resist. A resist composition of the present invention exhibits improved dry etching resistance, and is consequently ideal for this role.

As the dry etching method, conventional methods including chemical etching such as down-flow etching or chemical dry etching; physical etching such as sputter etching or ion beam etching; or chemical-physical etching such as RIE (reactive ion etching) can be used.

The most typical type of dry etching is parallel plate RIE. In this method, first, a resist laminate is placed inside the RIE apparatus chamber, and the required etching gas is introduced. A high frequency voltage is then applied within the chamber, between an upper electrode and the resist laminate holder which is positioned parallel to the electrode, and this causes the generation of a gas plasma. The plasma contains charged particles such as positive and negative ions and electrons, as well as electrically neutral active seeds. As these etching seeds adsorb to the lower resist layer, a chemical reaction occurs, and the resulting reaction product breaks away from the surface and is discharged externally, causing the etching to proceed.

EXAMPLES

As follows is a description of examples of the present invention, although the scope of the present invention is in no way limited by these examples. In evaluating the etching resistance, the etching resistance observed for the comparative example 1 was used as the standard by which the examples 1 to 10 were evaluated.

Example 1

First, the component (A) was prepared. Namely, poly(p-hydroxystyrene) (weight average molecular weight (Mw): 8,000, polydispersity (Mw/Mn): 1.2) and adamantoxy vinyl ether were reacted together by normal methods in the presence of an acid catalyst, thus forming a resin (A1) in which a portion of the hydroxyl groups of the poly(p-hydroxystyrene) had been protected with acid dissociable, dissolution inhibiting groups represented by the aforementioned formula (II-a).

When this resin was analyzed by $^1$H-NMR, the quantity of acid dissociable, dissolution inhibiting groups represented by the formula (II-a) relative to the total number of hydroxyl groups from p-hydroxystyrene was 26%. This indicates a protection ratio for the hydroxyl groups of 26 mol %.

Using this resin (A1) as the component (A), 100 parts by weight of this component (A), 6.0 parts by weight of triphenylsulfonium trifluoromethanesulfonate as the component (B), 0.675 parts by weight of trioctylamine as the component (D), 0.27 parts by weight of salicylic acid, and 0.05 parts by weight of a non-ionic fluorine-silicone based surfactant (brand name: MEGAFAC R-08 (manufactured by Dainippon Ink and Chemicals, Incorporated)) were dissolved in 1300 parts by weight of propylene glycol monomethyl ether acetate (hereafter abbreviated as "PM"), thus yielding a positive resist composition.

Meanwhile, a substrate was prepared by treating an 8 inch diameter silicon wafer with hexamethyldisilazane.

The positive resist composition obtained above was applied to the surface of this substrate using a spinner, and then prebaked and dried on a hotplate at 110° C. for 90 seconds, forming a resist layer with a film thickness of 200 nm.

Next, this photoresist layer was exposed using an electron beam lithography apparatus (HL-800D, manufactured by Hitachi, Ltd., accelerating voltage 70 kV), using a method in which the pattern was formed by direct irradiation of the electron beam onto the photoresist layer.

A PEB treatment was then performed at 110° C. for 90 seconds, and the photoresist layer was subjected to puddle development for 60 seconds at 23° C. in a 2.38% by weight aqueous solution of tetramethylammonium hydroxide, and then rinsed with pure water for 30 seconds. The resist was then shaken dry, and then further dried by heating at 100° C. for 60 seconds, thus forming a 1:1 line and space resist pattern.

Inspection of the thus obtained resist pattern using a SEM (scanning electron microscope) confirmed that excellent resolution could be obtained at a line width of 80 nm. Furthermore, the cross-sectional shape of the resist pattern was rectangular. Moreover, no pattern collapse had occurred.

Subsequently, using the thus obtained resist pattern as a mask, an etching rate test was conducted by subjecting the substrate to dry etching. Namely, when the etching rate was measured using a mixed gas of oxygen and tetrafluoromethane as the etching gas, the etching rate was 1.3 times slower than the rate observed in the comparative example 1, indicating an excellent level of etching resistance.

Example 2

With the exception of altering the component (B) to α-(methylsulfonyloxyimino)-p-methoxyphenylacetonitrile, testing was conducted in use same manner as the example 1. Inspection of the obtained resist pattern using a SEM (scanning electron microscope) confirmed that excellent resolution could be obtained at a line width of 80 nm. Furthermore, the cross-sectional shape of the resist pattern was rectangular. Moreover, no pattern collapse had occurred. When the etching rate was measured, the etching rate was 1.3 times slower than the rate observed in the comparative example 1, indicating an excellent level of etching resistance.

Comparative Example 1

A resin component containing poly(p-hydroxystyrene) (weight average molecular weight (Mw): 8,000, polydispersity (Mw/Mn): 1.2) in which a portion of the hydroxyl groups had been protected with 1-ethoxyethyl groups (hydroxyl group protection ratio: 45 mol %) was used instead of the resin (A1) of the component (A) from the example 1. With the exception of using this resin component, a resist composition was prepared in the same manner as the example 1.

Following formation of a 90 nm 1:1 line and space pattern using this resist composition, in the same manner as the example 1, an etching rate test was conducted. The results of this test revealed that the etching resistance was inferior to that observed for the examples 1 through 10. Furthermore, some slight pattern collapse was also observed.

Example 3

First, the component (A) was prepared. Namely, poly(p-hydroxystyrene) (weight average molecular weight (Mw): 8,000, polydispersity (Mw/Mn): 1.2) and naphthoxy vinyl ether were reacted together by normal methods in the presence of an acid catalyst, thus forming a resin (A2) in which a portion of the hydroxyl groups of the poly(p-hydroxystyrene) had been protected with acid dissociable, dissolution inhibiting groups represented by the aforementioned formula (II-b).

When this resin was analyzed by $^1$H-NMR, the quantity of acid dissociable, dissolution inhibiting groups represented by the formula (II-b) relative to the total number of hydroxyl groups from p-hydroxystyrene was 26%. This indicates a protection ratio for the hydroxyl groups of 26 mol %.

With the exception of using this resin (A2) as the component (A), a positive resist composition was prepared in the same manner as the example 1.

Using the thus obtained positive resist composition, a 1:1 line and space pattern was formed in the same manner as the example 1.

Inspection of the thus obtained resist pattern confirmed that excellent resolution could be obtained at a line width of 80 nm. Furthermore, although the cross-sectional shape of the resist pattern was slightly tapered, no pattern collapse had occurred. When the etching rate was measured, the etching rate was 1.1 times slower than the rate observed in the comparative example 1.

In these examples, the term "slightly tapered" means the shape is very close to rectangular, with just a hint of tapering.

Example 4

With the exception of altering the component (B) to α-(methylsulfonyloxyimino)-p-methoxyphenylacetonitrile, testing was conducted in the same manner as the example 3. Inspection of the obtained resist pattern using a SEM (scanning electron microscope) confirmed that excellent resolution could be obtained at a line width of 80 nm. Furthermore, although the cross-sectional shape of the resist pattern was slightly tapered, no pattern collapse had occurred. When the etching rate was measured, the etching rate was 1.1 times slower than the rate observed in the comparative example 1.

Example 5

First, the component (A) was prepared. Namely, a copolymer of p-hydroxystyrene and styrene (molar ratio: 85:15, weight average molecular weight (Mw): 8,000, polydispersity (Mw/Mn): 1.2) and adamantoxy vinyl ether were reacted together by normal methods in the presence of an acid catalyst, thus forming a resin (A3) in which a portion of the hydroxyl groups of the p-hydroxystyrene structural units contained within the copolymer had been protected with acid dissociable, dissolution inhibiting groups represented by the aforementioned formula (II-a).

When this resin was analyzed by $^1$H-NMR, the ratio of the total number of hydroxyl groups from p-hydroxystyrene relative to the number of acid dissociable, dissolution inhibiting groups represented by the formula (II-a) was 70:15. This indicates that the proportion of structural units protected by the acid dissociable, dissolution inhibiting groups relative to the total number of structural units contained within the resin (A3) was 15 mol %.

With the exception of using this resin (A3) as the component (A), a positive resist composition was prepared in the same manner as the example 1.

Using the thus obtained positive resist composition, a 1:1 line and space pattern was formed in the same manner as the example 1.

Inspection of the thus obtained resist pattern confirmed that excellent resolution could be obtained at a line width of 120 nm. Furthermore, although the cross-sectional shape of the resist pattern was slightly tapered, no pattern collapse had occurred. When the etching rate was measured, the etching rate was 1.4 times slower than the rate observed in the comparative example 1, indicating an excellent level of etching resistance.

Example 6

With the exception of altering the component (B) to α-(methylsulfonyloxyimino)-p-methoxyphenylacetonitrile, testing was conducted in the same manner as the example 5. Inspection of the obtained resist pattern confirmed that excellent resolution could be obtained at a line width of 120 nm. Furthermore, although the cross-sectional shape of the resist pattern was slightly tapered, no pattern collapse had occurred. When the etching rate was measured, the etching rate was 1.4 times slower than the rate observed in the comparative example 1, indicating an excellent level of etching resistance.

Example 7

With the exception of using a mixed resin of the resin (A1) obtained in the example 1 and the resin (A3) in the example 5 (molar ratio 20:80) as the component (A), a positive resist composition was prepared in the same manner as the example 1.

Using the thus obtained positive resist composition, a 1:1 line and space pattern was formed in the same manner as the example 1.

Inspection of the thus obtained resist pattern confirmed that excellent resolution could be obtained at a line width of 80 nm. Furthermore, the cross-sectional shape of the resist pattern was rectangular, and no pattern collapse had occurred. When the etching rate was measured, the etching rate was 1.4 times slower than the rate observed in the comparative example 1, indicating an excellent level of etching resistance.

Example 8

With the exception of altering the component (B) to α-(methylsulfonyloxyimino)-p-methoxyphenylacetonitrile, testing was conducted in the same manner as the example 7. Inspection of the obtained resist pattern using a SEM (scanning electron microscope) confirmed that excellent resolution could be obtained at a line width of 80 nm. Furthermore, the cross-sectional shape of the resist pattern was rectangular, and no pattern collapse had occurred. When the etching rate was measured, the etching rate was 1.4 times slower than the rate observed in the comparative example 1, indicating an excellent level of etching resistance.

Example 9

With the exception of using a mixed resin of the resin (A2) obtained in the example 3 and the resin (A3) obtained in the example 5 (molar ratio 50:50) as the component (A), a positive resist composition was prepared in the same manner as the example 1.

Using the thus obtained positive resist composition, a 1:1 line and space pattern was formed in the same manner as the example 1.

Inspection of the thus obtained resist pattern confirmed that excellent resolution could be obtained at a line width of 120 nm. Furthermore, although the cross-sectional shape of the resist pattern was slightly tapered, no pattern collapse had occurred. When the etching rate was measured, the etching rate was 1.2 times slower than the rate observed in the comparative example 1, indicating an excellent level of etching resistance.

Example 10

With the exception of altering the component (B) to α-(methylsulfonyloxyimino)-p-methoxyphenylacetonitrile, testing was conducted in the same manner as the example 9. Inspection of the obtained resist pattern confirmed that excellent resolution could be obtained at a line width of 120 nm. Furthermore, although the cross-sectional shape of the resist pattern was slightly tapered, no pattern collapse had occurred. When the etching rate was measured, the etching rate was 1.4 times slower than the rate observed in the comparative example 1, indicating an excellent level of etching resistance.

Effects of the Invention

As described above, according to the present invention there are provided a positive resist composition which exhibits a high level of etching resistance and enables high resolution to be attained, and a method of forming patterns that uses the positive resist composition.

What is claimed is:

1. A positive resist composition, comprising a resin component (A) which contains acid dissociable, dissolution inhibiting groups, and exhibits increased alkali solubility under action of acid, and an acid generator component (B) that generates acid on exposure, wherein said resin component (A) is a polymer, comprising structural units (a1) represented by a general formula (I) shown below, wherein a portion of hydroxyl groups of said structural units (a1) are protected with said acid dissociable, dissolution inhibiting groups represented by a general formula (II) shown below

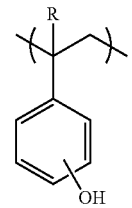

(wherein, R represents a hydrogen atom or a methyl group)

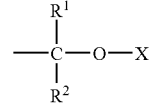

(wherein, $R^1$ represents an alkyl group of 1 to 5 carbon atoms, $R^2$ represents a hydrogen atom, X represents an adamantyl group, and the oxygen atom in the general formula (II) is bonded at the 1-position of the adamantyl group as X).

2. a positive resist composition according to claim 1, wherein a weight average molecular weight of said polymer of said component (A), prior to protection with said acid dissociable, dissolution inhibiting group, is within a range from 2,000 to 30,000.

3. A positive resist composition according to claim 1, wherein a polydispersity of said polymer of said component (A), prior to protection with said acid dissociable, dissolution inhibiting groups, is no more than 2.0.

4. A positive resist composition according to claim 1, wherein a proportion of said structural units (a1) that have been protected with said acid dissociable, dissolution inhibiting groups, relative to a combined total of all structural units that constitute said polymer of said component (A), is within a range from 5 to 35 mol %.

5. A positive resist composition according to claim 1, further comprising a nitrogen-containing organic compound (D), wherein said component (D) comprises a secondary or tertiary aliphatic amine containing an alkyl group of 7 to 15 carbon atoms.

6. A positive resist composition according to claim 1, which can be used in a method of forming resist patterns comprising an exposure step that uses an electron beam.

7. A method of forming resist patterns, comprising the steps of:
applying a positive resist composition according to claim 1 to a substrate;
conducting a prebake;
performing selective exposure;
conducting post exposure baking (PEB); and
performing alkali developing to form a resist pattern.

8. The positive resist composition according to claim 1, wherein a portion of hydroxyl groups of said structural units (a1) are protected by substituting hydrogen atoms of said hydroxyl groups with acid dissociable, dissolution inhibiting groups represented by a general formula (II-a) shown below.

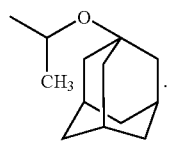

(II-a)

9. The positive resist composition according to claim 1, wherein said polymer of said component (A) further comprises structural units (a2) represented by a general formula (III) shown below:

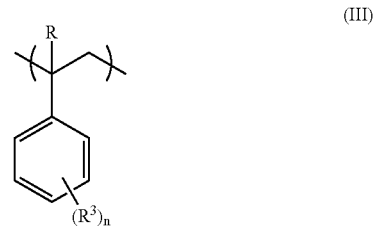

(III)

(wherein, R represents a hydrogen atom or a methyl group, $R^3$ represents an alkyl group of 1 to 5 carbon atoms, and n represents either 0, or an integer from 1 to 3).

* * * * *